United States Patent
Leobandung

(10) Patent No.: US 9,754,819 B2
(45) Date of Patent: Sep. 5, 2017

(54) INTERLEVEL AIRGAP DIELECTRIC

(71) Applicant: International Business Machines Corporation, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/977,945

(22) Filed: Dec. 22, 2015

(65) Prior Publication Data

US 2017/0178948 A1  Jun. 22, 2017

(51) Int. Cl.
| | |
|---|---|
| *H01L 23/48* | (2006.01) |
| *H01L 23/52* | (2006.01) |
| *H01L 29/40* | (2006.01) |
| *H01L 21/768* | (2006.01) |
| *H01L 21/02* | (2006.01) |
| *H01L 21/285* | (2006.01) |
| *H01L 23/528* | (2006.01) |
| *H01L 23/532* | (2006.01) |
| *H01L 23/522* | (2006.01) |
| *H01L 21/3105* | (2006.01) |

(52) U.S. Cl.
CPC .... *H01L 21/7682* (2013.01); *H01L 21/02115* (2013.01); *H01L 21/2855* (2013.01); *H01L 21/3105* (2013.01); *H01L 21/76802* (2013.01); *H01L 21/76843* (2013.01); *H01L 21/76877* (2013.01); *H01L 23/528* (2013.01); *H01L 23/5226* (2013.01); *H01L 23/5329* (2013.01)

(58) Field of Classification Search
CPC ........... H01L 21/7682; H01L 21/76802; H01L 21/02115; H01L 21/76877; H01L 21/2855; H01L 21/76843; H01L 21/3105; H01L 23/5329; H01L 23/5226; H01L 23/528

See application file for complete search history.

(56) References Cited

U.S. PATENT DOCUMENTS

2010/0301491 A1* 12/2010 Yang .................. H01L 21/02063 257/773
2016/0118335 A1* 4/2016 Lee .................... H01L 23/53295 257/774

* cited by examiner

*Primary Examiner* — Thanh Y Tran
(74) *Attorney, Agent, or Firm* — Cantor Colburn LLP; Louis Percello

(57) ABSTRACT

A method of forming a semiconductor device includes: forming a lower trace in a lower dielectric layer; reducing a height of the lower trace a distance equal to gap height (g) to form an initial void region; filling the initial void region with an amorphous carbon layer; forming an upper dielectric layer above the amorphous carbon layer; covering the amorphous carbon layer with at least an oxide layer and a nitride layer; forming a hole in the oxide and nitride layers to expose a portion of the amorphous carbon layer; exposing the amorphous carbon layer to oxygen plasma to remove the amorphous carbon layer; sputtering a metal layer over the oxide layer and into a void created removal of the amorphous carbon layer to divide the void such that it includes an airgap; and forming an upper trace over the airgap.

12 Claims, 11 Drawing Sheets

INTERLEVEL AIRGAP DIELECTRIC

BACKGROUND

The present invention relates to semiconductor devices, and more specifically, to forming an inter-level airgap between wiring traces on different levels of the device.

As VLSI chips have scaled over the decades, interconnect or wire width and spacing has also scaled. If not properly designed, this scaling can be a limiter of circuit performance. For example, unintended capacitive coupling between two wires that are next to each other can often occur. When this happens, one signal can capacitively couple with another and cause what appears to be noise.

Several different solutions have been attempted to reduce or eliminate such capacitance. The solutions include layout design and, in extreme cases, providing insulators between the wiring on a single level.

SUMMARY

According to an embodiment, a method of forming a semiconductor device is disclosed. The method includes: forming a lower trace in a lower dielectric layer; reducing a height of the lower trace a distance equal to gap height (g) to form an initial void region; filling the initial void region with an amorphous carbon layer; forming an upper dielectric layer above the amorphous carbon layer; covering the amorphous carbon layer with at least an oxide layer and a nitride layer; forming a hole in the oxide and nitride layers to expose a portion of the amorphous carbon layer; exposing the amorphous carbon layer to oxygen plasma to remove the amorphous carbon layer; sputtering a metal layer over the oxide layer and into a void created removal of the amorphous carbon layer to divide the void such that it includes an airgap; and forming an upper trace over the airgap.

According to another embodiment, a semiconductor device is disclosed. The device includes a lower dielectric layer and a lower trace formed in the lower dielectric layer. The device also includes an upper dielectric layer, the upper dielectric layer being above the lower dielectric layer and a upper trace formed in the upper dielectric layer and being disposed over the lower trace. The device is formed to include an air gap between the upper and lower dielectric layers is located between the upper and lower traces.

According to another embodiment, semiconductor device that includes an air gap between upper and lower traces formed in upper and lower dielectric layers is disclosed. The device is formed by the process of: forming a lower trace in a lower dielectric layer; reducing a height of the lower trace a distance equal to gap height (g) to form an initial void region; filling the initial void region with an amorphous carbon layer; forming an upper dielectric layer above the amorphous carbon layer; covering the amorphous carbon layer with at least an oxide layer and a nitride layer; forming a hole in the oxide and nitride layers to expose a portion of the amorphous carbon layer; exposing the amorphous carbon layer to oxygen plasma to remove the amorphous carbon layer; sputtering a metal layer over the oxide layer and into a void created removal of the amorphous carbon layer to divide the void such that it includes an airgap; and forming an upper trace over the airgap.

BRIEF DESCRIPTION OF THE DRAWINGS

The accompanying figures wherein reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
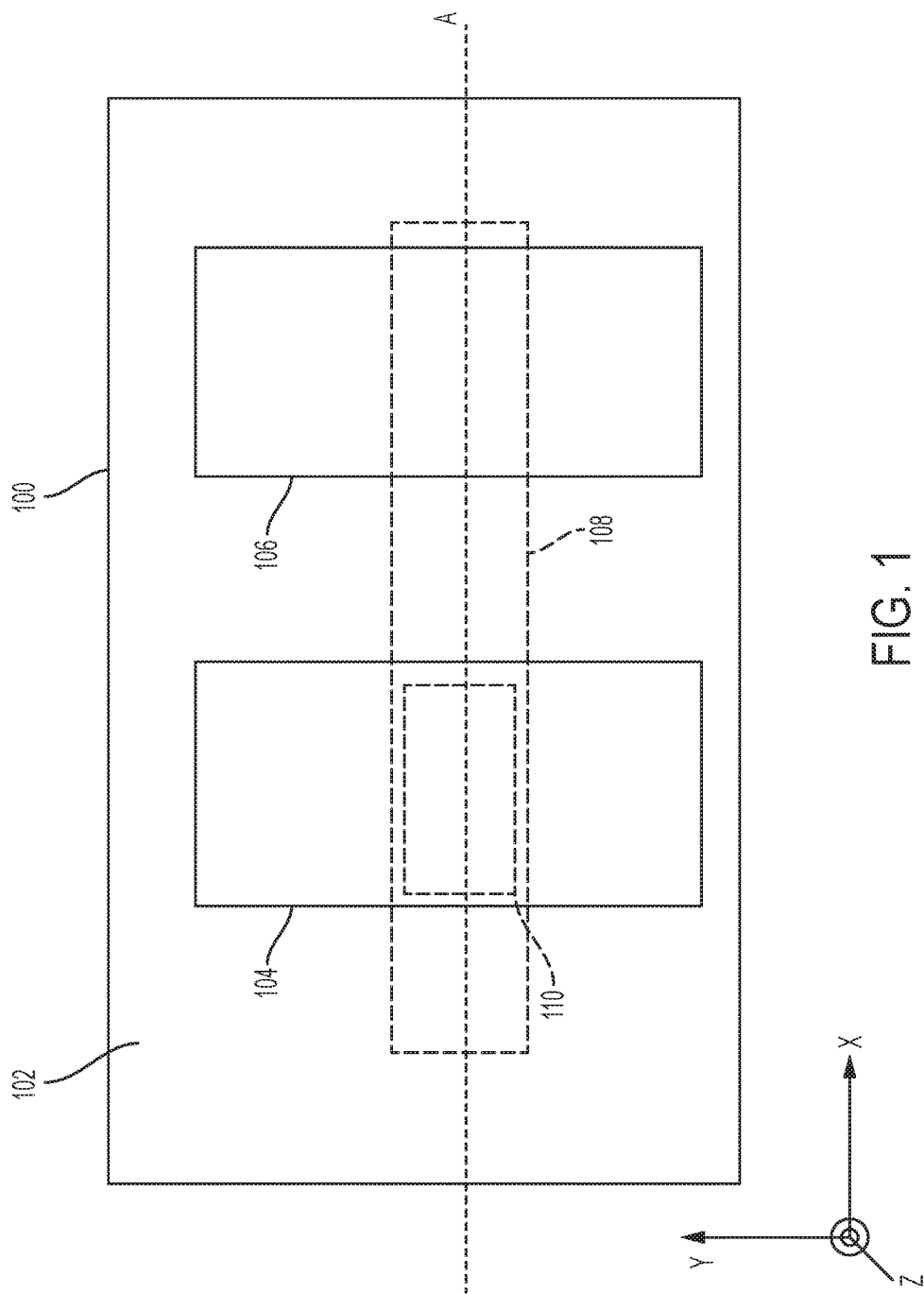
FIG. 1 shows a top view of a semiconductor device as a portion of an integrated circuit.

FIG. 1 shows a top-view of a portion of an integrated circuit (IC) 100. As will be understood from the disclosure herein, FIG. 1 represents a "finished" element of the process flow disclosed below. The portion shown includes a top level 102 on which multiple wiring traces may be formed. As shown, the top level 102 includes first and second wiring traces 104, 106. The IC 100 may also include one or more levels below the top level 102.

The terms above and below, as used herein, shall refer to relative locations along a z-axis (best shown in FIG. 2). An element is above another element if it is higher in the z-axis direction. An element is "over" another element if its downward projection in the z-direction intersects with the other element and, similarly, an element is "below" another element if its upward projection in the z-direction intersects the other element. The same applies to the terms above and under, respectively.

The IC 100 shown in FIG. 1 also includes a third or lower wiring trace 108. This lower trace 108 is disposed on a lower level of the IC 100 and is below one or both of the first and second traces 104, 106. The traces 104, 106, 108 are provided as examples only. It will be understood, that the size, configuration, orientation and paths taken by the wiring is not limited to those shown in FIG. 1. Further, any of the traces may be coupled to vias, computing elements, or any other element of an IC.

In one embodiment, the first trace 104 is directly electrically coupled to the lower trace 108 by a via 110. In one embodiment, the traces 104, 106, 108 are all formed at least partially of copper and may be surrounded by (at least partially) or separated from an adjacent material by a barrier layer. The barrier layer (discussed below) may include tantalum, tantalum nitride, titanium nitride, cobalt, ruthenium, manganese, and/or any combination thereof and may have a thickness in the z-axes that ranges from about 1-10 nm.

As will be further explained below, an airgap may be formed between at least the second trace 106 and the lower trace 108. This airgap is between the traces in the z-direction and may serve to reduce or eliminate capacitive or other coupling between the second trace 106 and the lower trace 108. The process flow to form such an air gap is described in FIGS. 2-11 below. In each figure, an intermediate element is shown that includes a reference numeral X00 where X is the figure number.

FIG. 1 also illustrates section line A. This line, while shown on a finished element, will be applied to the partially completed elements (e.g., formation stages) described below to provide the cross-sections shown in FIGS. 2-11. That is, FIGS. 2-11 are cross sections taken along section line A as applied to the intermediate element shown in the particular figure.

Figure 2:
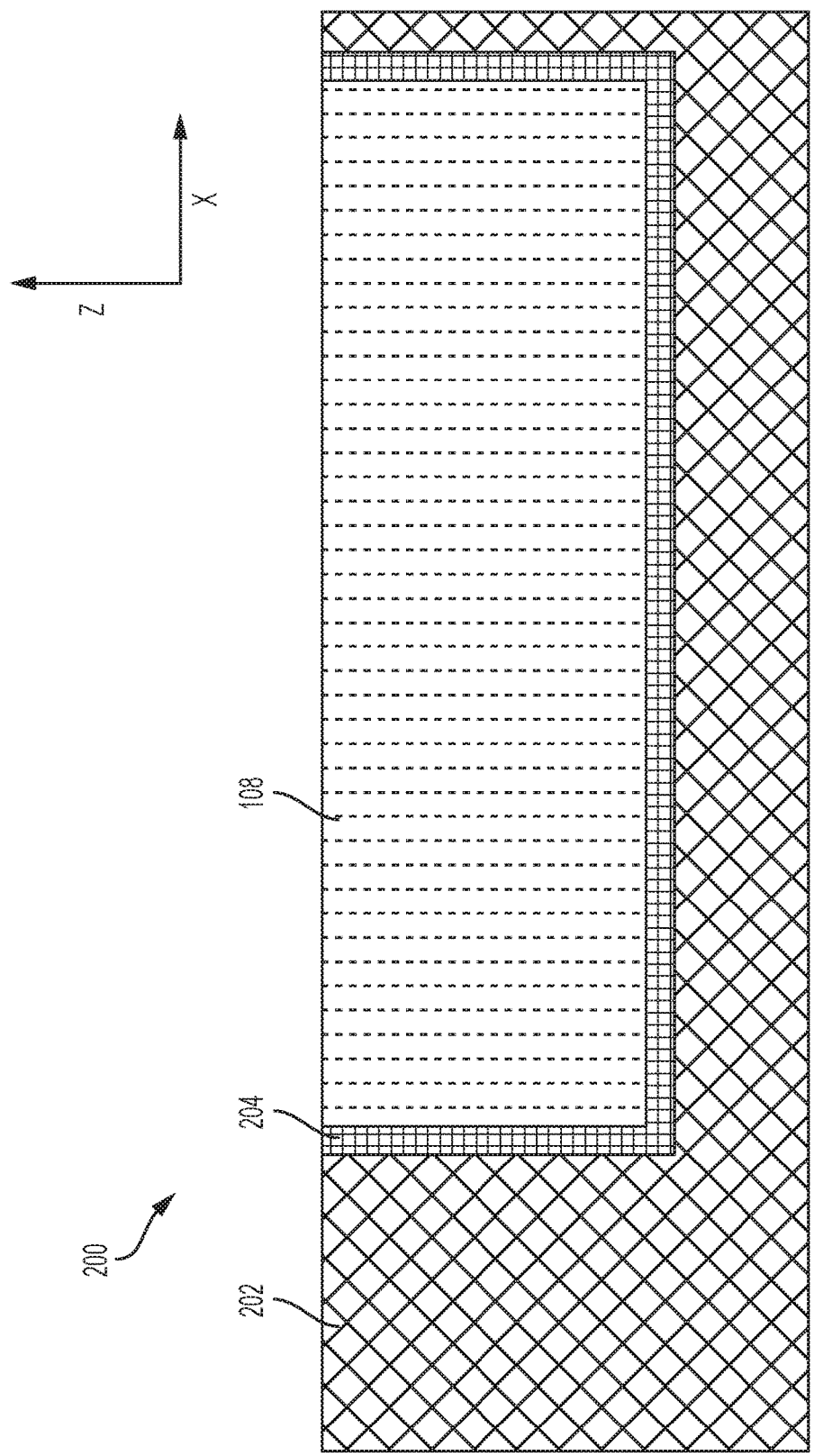
FIG. 2 is a side-view of one element formed during the production of the device of FIG. 1.

FIG. 2 shows an intermediate element 200 in a process flow after a copper trace has been formed in a lower dielectric layer 202. The copper trace is the lower trace 108 described above and is separated from the dielectric layer 202 by barrier layer 204. The lower dielectric layer may be formed of any type of dielectric include, for example, one including an oxide and may be referred to as an oxide layer herein. The barrier layer 204 may include tantalum, tantalum nitride, titanium nitride, cobalt, ruthenium, manganese, and/or any combination thereof and may have a thickness in the z-axes that ranges from about 1-10 nm. Formation intermediate element 200 is within the ability of the skilled artisan.

Figure 3:
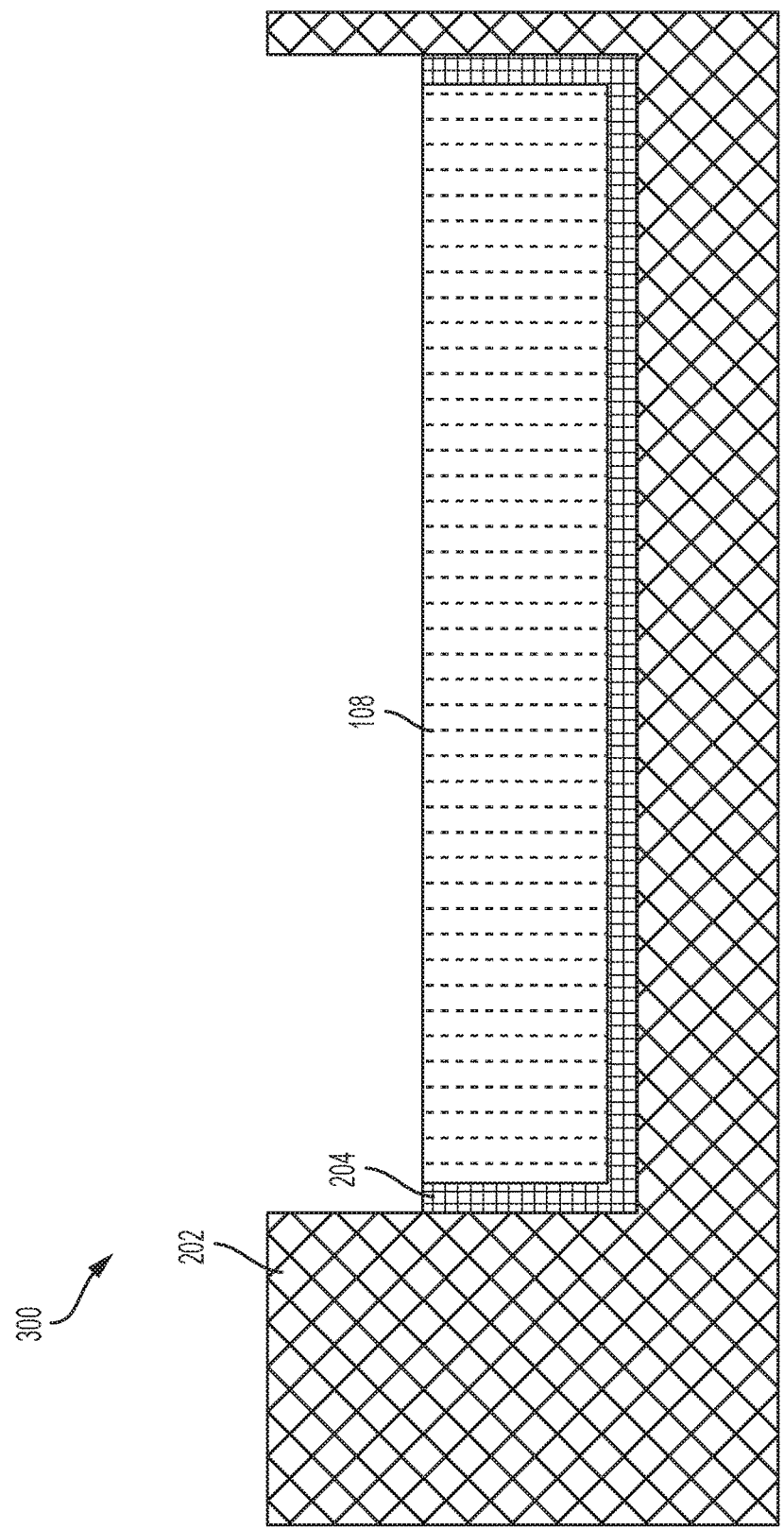
FIG. 3 is a side-view of an element formed during the production of the device of FIG. 1.

With reference now to FIG. 3, the barrier layer 204 and the lower trace 108 may be etched downward a distance g that is referred to herein as a gap height to form intermediate element 300. This may involve either or both dry (e.g., reactive ion etching (RIE)) and wet etching (e.g., using an acid or a metal etchant) or combination of both. In this manner, the height of the lower trace 108 is reduced by a gap height (g) to form an initial void region 308.

Figure 4:
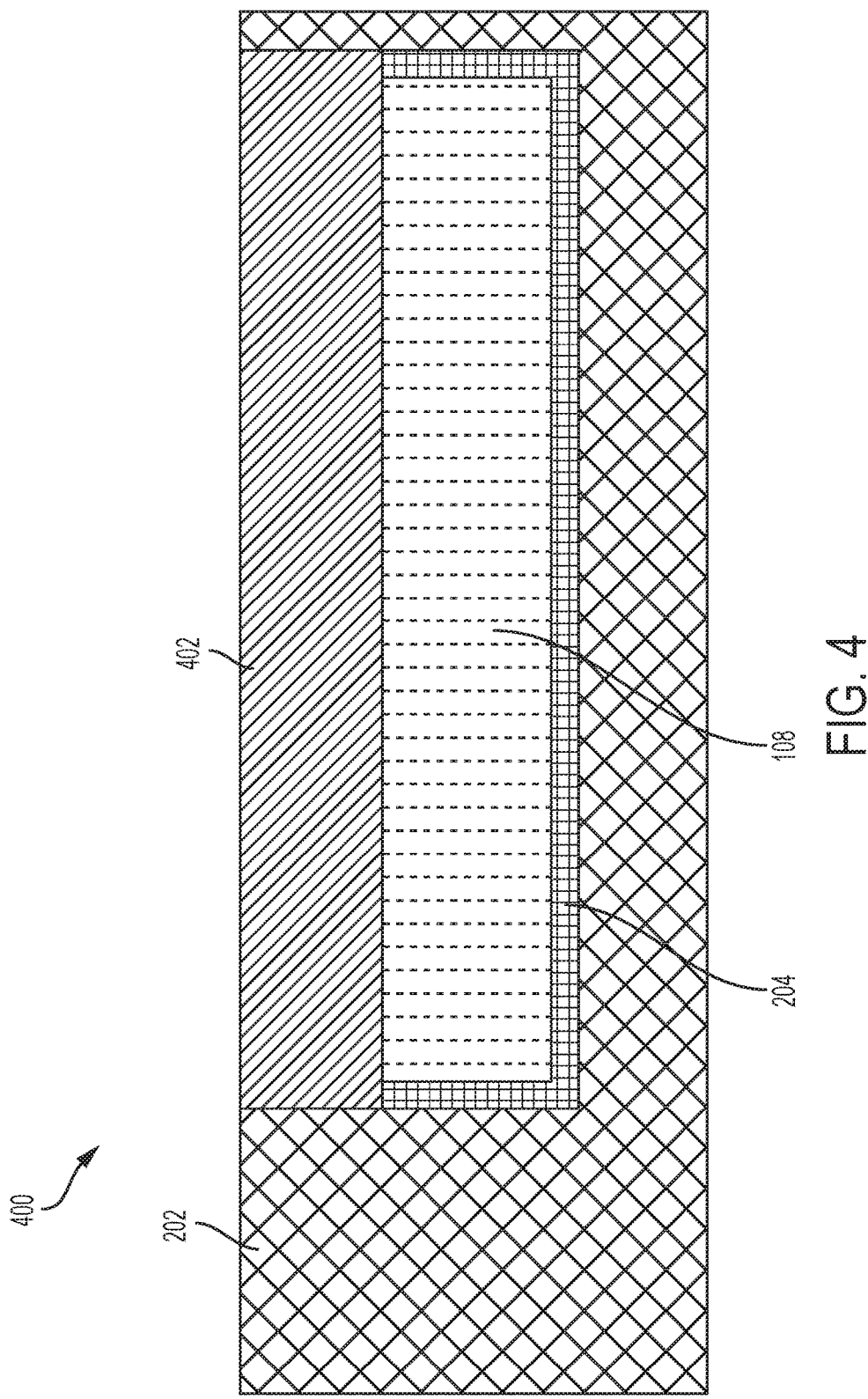
FIG. 4 is a side-view of an element formed during the production of the device of FIG. 1.

In FIG. 4, the initial void region 308 is filled with an amorphous carbon layer 402. The amorphous carbon layer 402 and the lower dielectric layer 202 may have upper surfaces that are level with one another. Other material can be deposited also beside a-C, as long as they can be selectively removed later with respect to other material such as oxide and nitride. Such may be accomplished by performing a chemical-mechanical planarization (CMP) on intermediate element 400.

Figure 5:
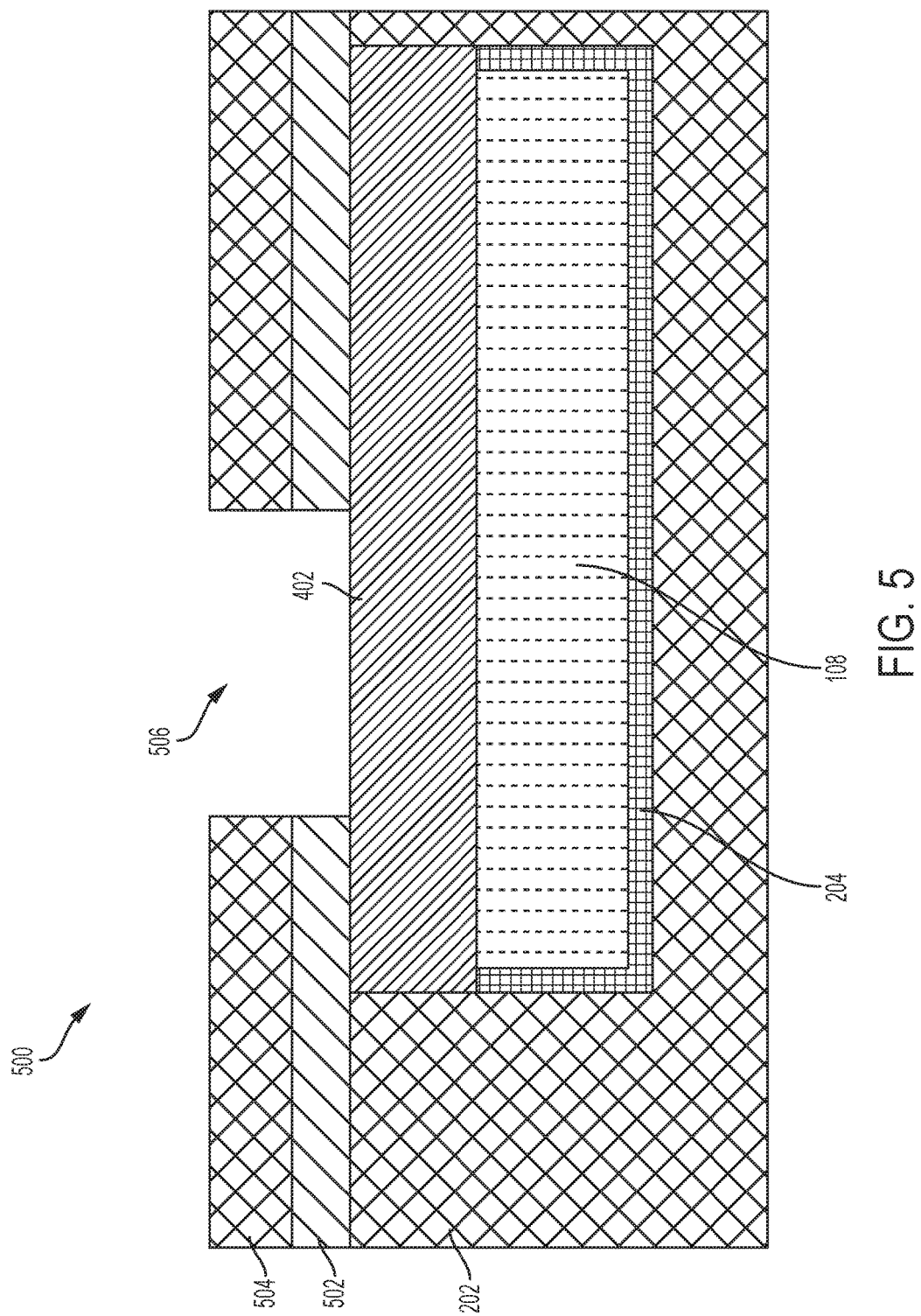
FIG. 5 is a side-view of an element formed during the production of the device of FIG. 1.

As shown in FIG. 5, a nitride layer 502 and an upper dielectric layer 504 are deposited over the intermediate element 400. Using RIE or another appropriate technique, a via hole 506 may be formed through layers 502, 504 to expose the amorphous carbon layer 402. Alternatively, an array of dummy via (non electrically active via) can be used to access the carbon layer 402 rather than the via hole 506.

Figure 6:
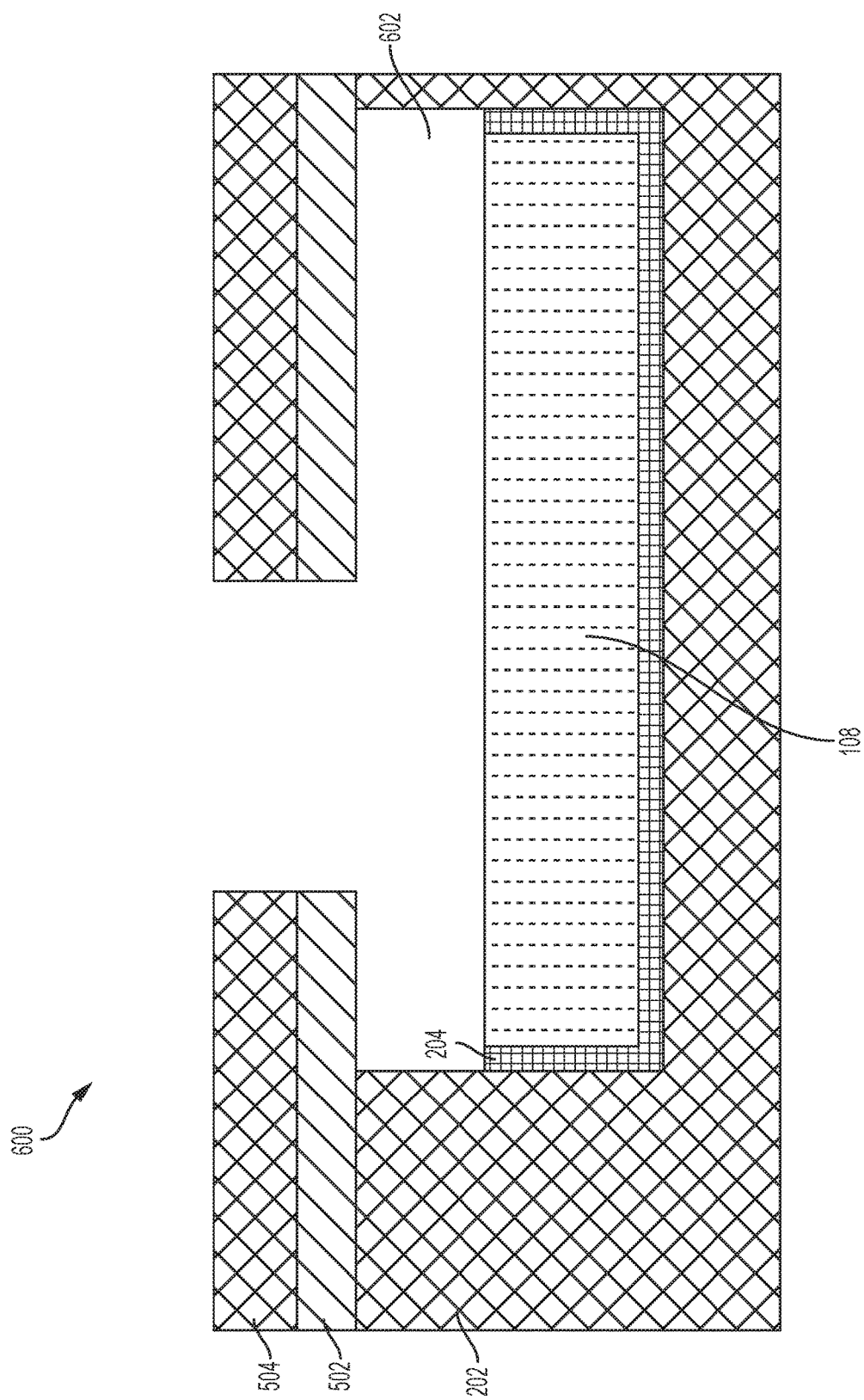
FIG. 6 is a side-view of an element formed during the production of the device of FIG. 1.

After the amorphous carbon layer 402 is exposed, an isotropic etching process is performed to remove the amorphous carbon layer 402. In more detail, a oxy-plasma containing process may react oxygen and the carbon to form $CO_2$ that may be removed via a vacuum process. With reference to FIG. 6, he resulting element, intermediate element 600, includes a void 602 that has a height equal to the gap height g.

Figure 7:
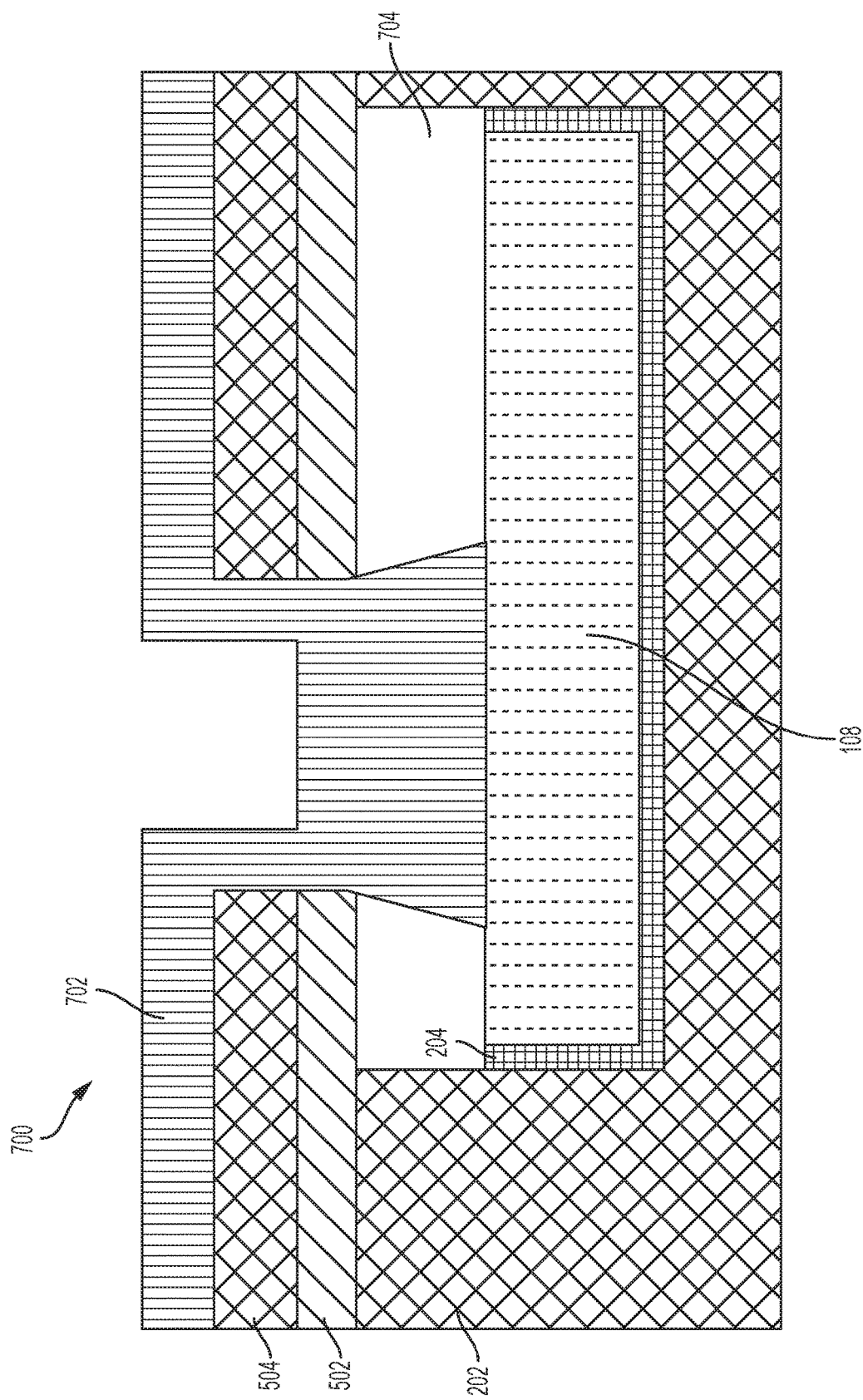
FIG. 7 is a side-view of an element formed during the production of the device of FIG. 1.

As shown in FIG. 7, a metal layer 702 may be sputtered over element 600 to form intermediate element 702. The metal layer 702 will cause void 602 to be divided and to include a closed region 704. This closed region may be referred to as an air gap and has a height g.

Figure 8:
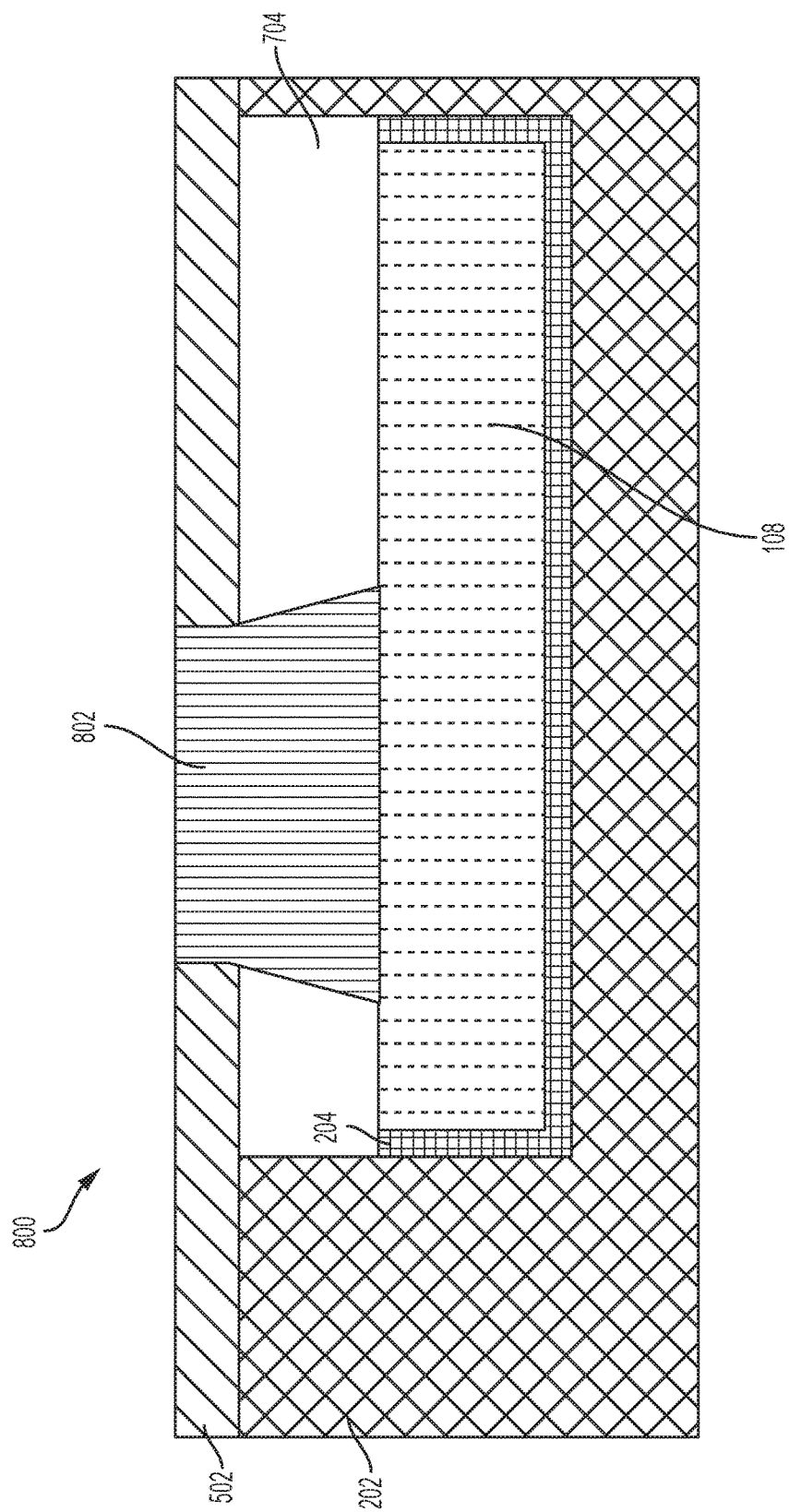
FIG. 8 is a side-view of an element formed during the production of the device of FIG. 1.

The oxide layer 504 and the metal layer 702 may be removed down to the level of the nitride layer 502 as shown in FIG. 8 by a CMP process. Such a processes will leave a via stub 802 that is in electrical contact with lower trace 108 and has an exposed end coplanar with an upper surface of the nitride layer 502.

Figure 9:
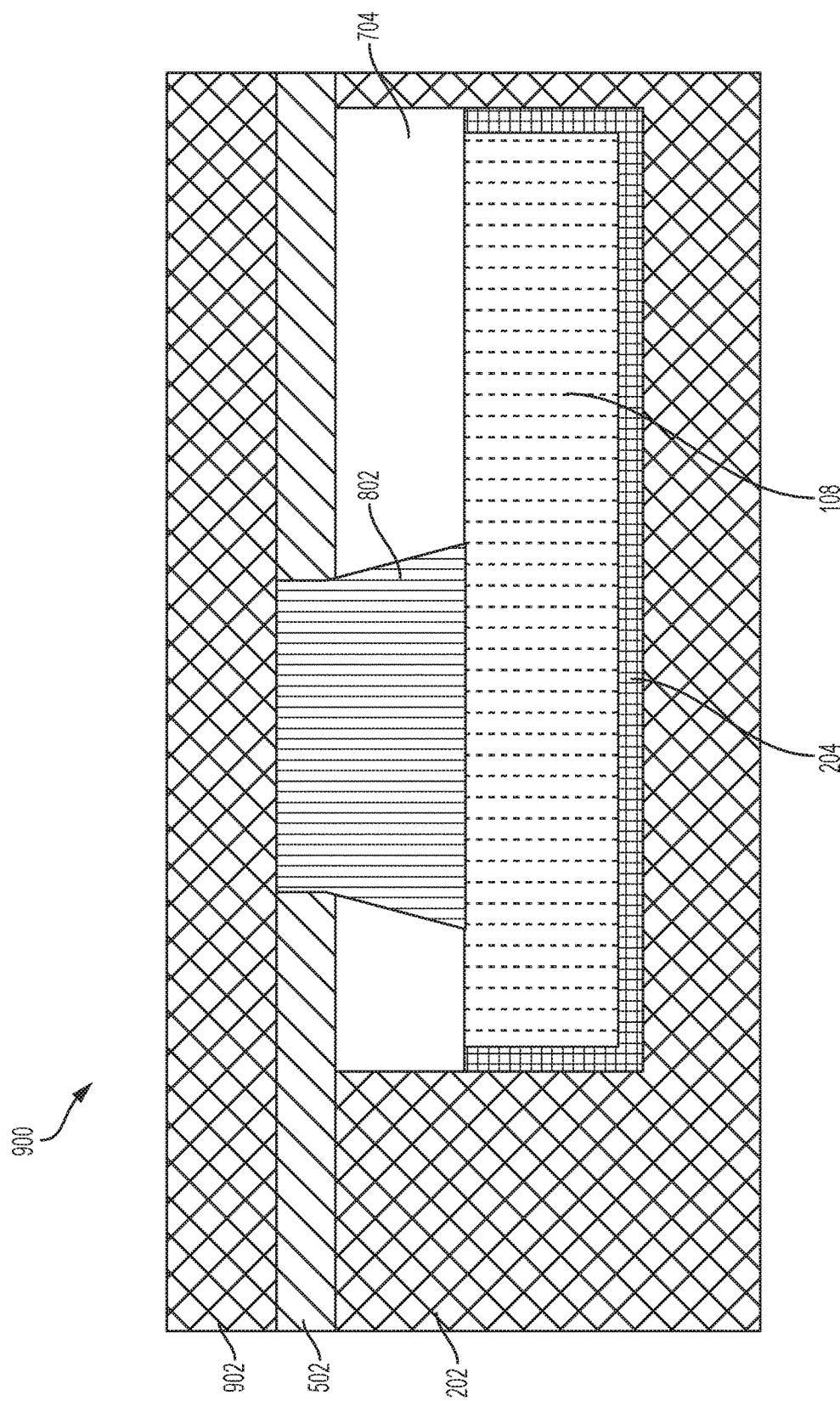
FIG. 9 is a side-view of an element formed during the production of the device of FIG. 1.
Figure 10:
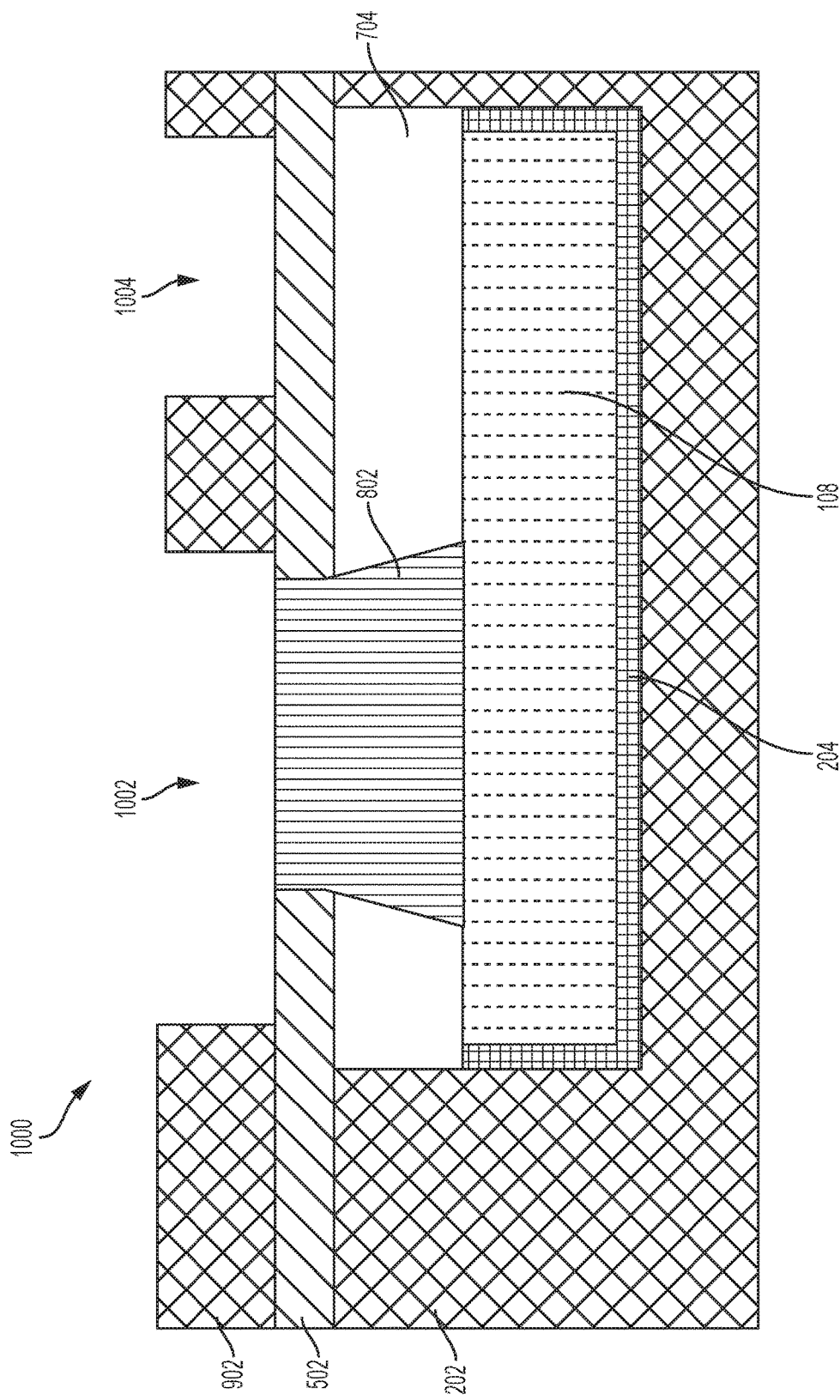
FIG. 10 is a side-view of an element formed during the production of the device of FIG. 1.
Figure 11:
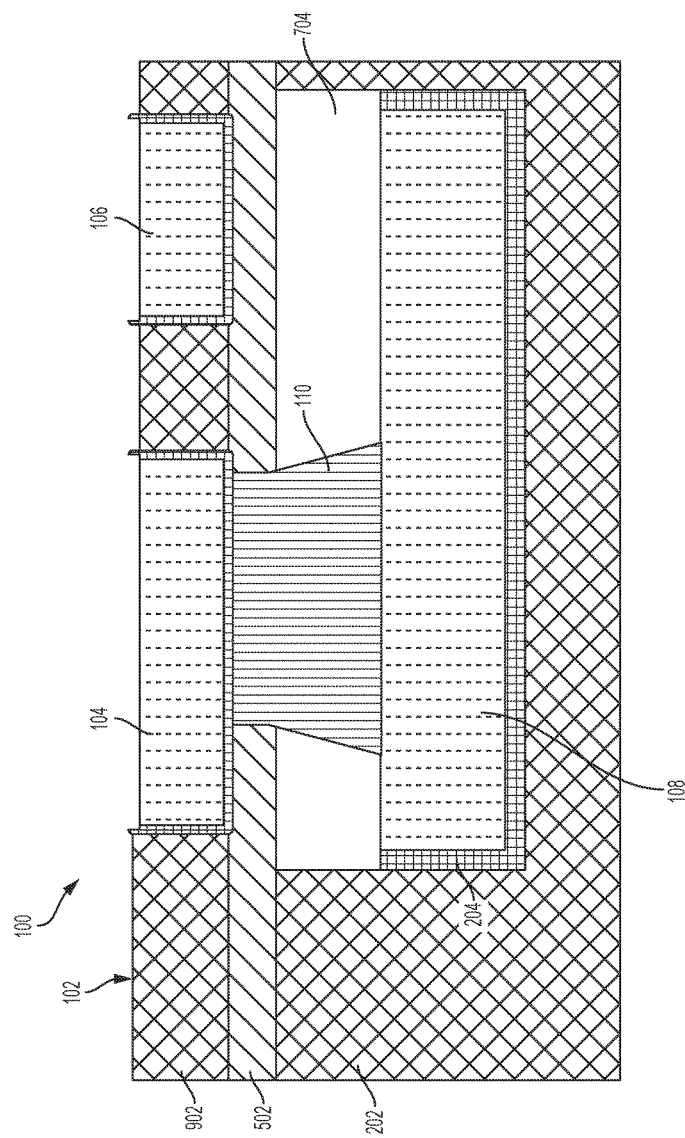
FIG. 11 is a side-view of the device of FIG. 1.

An upper dielectric layer 902 may then be formed over element 800 as shown in FIG. 9 and first and second trace paths 1002, 1004 may be formed through dielectric layer 902 (FIG. 10) such that first and second traces 104, 106 may be formed (FIG. 11). It shall be understood that FIG. 11 is a cross-section of the finished product as exemplified in FIG. 1. In FIG. 11, the second trace 106 is separated from the lower trace 108 by air gap 704. The height (g) of the airgap 704 will determine the amount of "insulation" between these two traces and, as such, can be selected to reduce or eliminate capacitive of other coupling between these two traces.

As illustrated, the lower trace and the first trace 104 are in direct electrical connection though via 110. Of course, such a connection is not needed and first trace 104 could be omitted in one embodiment. In such a case, first trace path 1002 may not be formed.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method of forming a semiconductor device, the method comprising:
forming a lower trace in a lower dielectric layer;
reducing a height of the lower trace for forming a distance equal to a gap height (g) to form an initial void region;
filling the initial void region with an amorphous carbon layer;

forming an upper dielectric layer above the amorphous carbon layer;

covering the amorphous carbon layer with at least an oxide layer and a nitride layer;

forming a hole in the oxide and nitride layers to expose a portion of the amorphous carbon layer;

exposing the amorphous carbon layer to oxygen plasma to remove the amorphous carbon layer;

sputtering a metal layer over the oxide layer and into a void created from removal of the amorphous carbon layer to divide the void such that the void includes an airgap; and forming an upper trace over the airgap.

2. The method of claim 1, wherein the oxide layer is over the nitride layer and the method further includes:

removing the metal and oxide layers that are above the nitride layer.

3. The method of claim 2, further comprising;

forming an upper dielectric over the nitride layer.

4. The method of claim 3, further comprising:

forming an upper trace gap in the upper dielectric, wherein the upper trace is formed in the upper trace gap.

5. The method of claim 4, further comprising:

forming a second trace gap in the upper dielectric over a portion of the metal layer that is below the nitride layer; and forming a second trace in the second trace gap that is in direct electrical communication with the lower trace through the portion of the metal layer that is below the nitride layer.

6. The method of claim 1, wherein a barrier layer is disposed between the lower trace and the lower dielectric.

7. A semiconductor device that includes an air gap between upper and lower traces formed in upper and lower dielectric layers, the device formed by a process of:

forming the lower trace in the lower dielectric layer;

reducing a height of the lower trace a distance equal to a gap height (g) to form an initial void region;

filling the initial void region with an amorphous carbon layer;

forming the upper dielectric layer above the amorphous carbon layer;

covering the amorphous carbon layer with at least an oxide layer and a nitride layer;

forming a hole in the oxide and nitride layers to expose a portion of the amorphous carbon layer;

exposing the amorphous carbon layer to oxygen plasma to remove the amorphous carbon layer;

sputtering a metal layer over the oxide layer and into a void created from removal of the amorphous carbon layer to divide the void such that the void includes an airgap; and forming the upper trace over the airgap.

8. The device of claim 7, wherein the oxide layer is over the nitride layer and the method further includes:

removing the metal and oxide layers that are above the nitride layer.

9. The device of claim 8, further comprising;

forming an upper dielectric over the nitride layer.

10. The device of claim 9, further comprising:

forming an upper trace gap in the upper dielectric, wherein the upper trace is formed in the upper trace gap.

11. The device of claim 10, further comprising:

forming a second trace gap in the upper dielectric over a portion of the metal layer that is below the nitride layer; and forming a second trace in the second trace gap that is in direct electrical communication with the lower trace through the portion of the metal layer that is below the nitride layer.

12. The device of claim 7, wherein a barrier layer is disposed between the lower trace and the lower dielectric.

* * * * *